United States Patent
Gidon et al.

(10) Patent No.: US 8,835,924 B2
(45) Date of Patent: Sep. 16, 2014

(54) PHOTO-DETECTING DEVICE AND METHOD OF MAKING A PHOTO-DETECTING DEVICE

(75) Inventors: Pierre Gidon, Echirolles (FR); Benoit Giffard, Grenoble (FR); Norbert Moussy, Sainte Agnes (FR)

(73) Assignee: Commissariat a l'energie atomique et aux energies Alternatives, Paris (FR)

( * ) Notice: Subject to any disclaimer, the term of this patent is extended or adjusted under 35 U.S.C. 154(b) by 449 days.

(21) Appl. No.: 13/381,435

(22) PCT Filed: Jul. 5, 2010

(86) PCT No.: PCT/EP2010/059518
§ 371 (c)(1),
(2), (4) Date: Dec. 29, 2011

(87) PCT Pub. No.: WO2011/003843
PCT Pub. Date: Jan. 13, 2011

(65) Prior Publication Data
US 2012/0097946 A1    Apr. 26, 2012

(30) Foreign Application Priority Data
Jul. 7, 2009   (FR) ..................... 09 54686

(51) Int. Cl.
*H01L 29/04* (2006.01)
*H01L 27/146* (2006.01)
*H01L 31/0224* (2006.01)

(52) U.S. Cl.
CPC ..... *H01L 27/14647* (2013.01); *H01L 27/14687* (2013.01); *H01L 27/14603* (2013.01); *H01L 27/14636* (2013.01); *H01L 27/14689* (2013.01); *H01L 27/14632* (2013.01); *H01L 27/14692* (2013.01); *H01L 31/022408* (2013.01)

USPC ............. 257/53; 257/E27.133; 257/E31.047

(58) Field of Classification Search
USPC .................. 257/53, E27.133, E31.047
See application file for complete search history.

(56) References Cited

U.S. PATENT DOCUMENTS

| 4,011,016 A | 3/1977 | Layne et al. |
| 4,581,625 A | 4/1986 | Gay et al. |

(Continued)

FOREIGN PATENT DOCUMENTS

WO   WO 2007/061175 A1   5/2007

OTHER PUBLICATIONS

French Preliminary Search Report issued Apr. 8, 2010 in patent Application No. FR0954686.

(Continued)

*Primary Examiner* — Matthew Reames
(74) *Attorney, Agent, or Firm* — Oblon, Spivak, McClelland, Maier & Neustadt, L.L.P.

(57) ABSTRACT

A photo-detecting device including a plurality of pixels, each including at least one alternate stack of photodiodes and electrically conducting electrodes. Each photodiode includes one intrinsic amorphous semiconductor layer in contact with one doped amorphous semiconductor layer distinct from the amorphous semiconductor layers in other photodiodes, and is arranged between two electrodes. Each pair of photodiodes includes one of the electrodes arranged between photodiodes. In each pixel: each electrode includes an electrically conducting portion not superposed on other electrodes of the pixel and electrically connected to one interconnection hole filled with an electrically conducting material; and portions of an electrically conducting material are superposed approximately on each of non-superposed portions of electrodes.

14 Claims, 4 Drawing Sheets

(56) References Cited

U.S. PATENT DOCUMENTS

| | | |
|---|---|---|
| 4,785,186 A | 11/1988 | Street et al. |
| 6,606,120 B1 | 8/2003 | Merrill et al. |
| 6,891,242 B2 | 5/2005 | Gidon et al. |
| 7,271,375 B2 | 9/2007 | Gidon et al. |
| 7,411,620 B2 | 8/2008 | Taniguchi et al. |
| 2005/0205958 A1 | 9/2005 | Taniguchi et al. |
| 2005/0263839 A1 | 12/2005 | Suzuki |
| 2005/0264662 A1 | 12/2005 | Suzuki et al. |
| 2006/0011930 A1 | 1/2006 | Tamai et al. |
| 2006/0261242 A1 | 11/2006 | Kim |
| 2008/0055443 A1 | 3/2008 | Okamoto et al. |
| 2008/0073736 A1 | 3/2008 | Hwang |
| 2009/0135282 A1 | 5/2009 | Gidon |
| 2009/0147263 A1 | 6/2009 | Parrein et al. |
| 2009/0302407 A1 | 12/2009 | Gidon et al. |
| 2010/0059803 A1 | 3/2010 | Gidon et al. |
| 2012/0085944 A1 | 4/2012 | Gidon et al. |

OTHER PUBLICATIONS

N. Moussy et al., "A Highly Reliable Amorphous Silicon Photosensor for Above IC CMOS Image Sensor", Electron Devices Meeting 2006, IEDM '06 International.

Dietmar Knipp et al., "Color Aliasing Free Thin-Film Sensor Array", Sensor and Actuators A 128 (2006) 333-338.

PHOTO-DETECTING DEVICE AND METHOD OF MAKING A PHOTO-DETECTING DEVICE

TECHNICAL FIELD

The invention relates to the field of microelectronic photo-detecting devices or image sensors, and more particularly the field of coloured photo-detecting devices of the "above IC" type, in other words comprising a photo-detector part placed above an integrated circuit that processes electric charges generated by the photo-detecting part.

The invention also relates to a method of making such a photo-detecting device, particularly of the "above IC" type.

STATE OF PRIOR ART

There are several types of microelectronic image sensors:
- so-called CCD (Coupled Charge Device) sensors that generate electron-hole pairs from light photons received by the sensor by a photoelectric effect in a crystalline semiconductor substrate, and then collect electrons in the potential wells,
- so-called CMOS (Complementary Metal Oxide Semiconductor) or APS (Active Pixel Sensor) sensors in which each collection zone of charges generated in a crystalline semiconductor is accompanied by an amplifier,
- so-called "above IC" sensors which are part of the family of CMOS sensors, in which charges are generated in one or several photo-detecting materials placed above an integrated circuit acting mainly as an amplifier.

Microelectronic image sensors are usually fitted with 3 or 4 colour filters placed side by side on different photo-detectors of the sensor in order to determine the colorimetric coordinates, for example conforming with the CIE XYZ, RGB or Lab standards, of received light. The document entitled "A highly reliable Amorphous Silicon photosensor for above IC CMOS image sensor" by N. Moussy et al., International Electron Devices Meeting 2006, IEDM'06, Dec. 11-13 2006, pages 1-3, describes such an image sensor, that is also shown in FIG. 1 and is marked as reference 1.

This image sensor 1 is composed of two parts: the integrated circuit and the retina located above the integrated circuit (above IC). The integrated circuit comprises a substrate 2 on which CMOS transistors 4 are made. A dielectric layer 6 covers the CMOS transistors 4. Several layers of electrical interconnections electrically connected to each other and to CMOS transistors 4 are made in the dielectric layer 6. In the example shown in FIG. 1, the sensor 1 comprises a first layer of interconnections 8 and a second layer of interconnections 10. The retina formed by elements located above the dielectric layer 6 comprises several lower electrodes 12, for example composed of chromium. Each pixel in the sensor 1 comprises one of the lower electrodes 12. These lower electrodes 12 are electrically connected to the second layer of interconnections 10 and are covered by a thick layer of intrinsic amorphous silicon 14, itself covered by a thin layer of doped amorphous silicon 16. A transparent upper electrode 18 composed of ITO (indium and tin oxide) and common to all pixels in sensor 1, is arranged on the thin layer of doped amorphous silicon 16. A passivation layer 20 separates the coloured filters 22 (one filter per pixel and for example arranged as a Bayer filter) from the upper electrode 18. The coloured filters 22 are covered by a planarisation layer 24 on which the micro-lenses 26 (one per pixel) are located.

Considering that the amorphous silicon layers 14 and 16 have different dopings (one being intrinsic and the other being doped), they form a metallurgical junction and therefore a photodiode. Light absorbed in these layers 14, 16 of amorphous silicon generates electrical charges that are then separated by the electrical field present in the photodiode. The collected charges form the electric signal that is then amplified by the integrated circuit in the sensor 1.

In such an image sensor, the coloured filters absorb more than two thirds of the light received by the sensor. Therefore, only one third of the received light is available for the actual photo-detection.

It is also known that colour image sensors can be made without any coloured filters. For example, document US 2005/0205958 A1 discloses an image sensor without any coloured filters but with various photo-detecting layers stacked in it.

This sensor also comprises a large number of electrodes in the form of electrically conducting layers separated from each other by dielectric layers and inserted between the photo-detecting layers. In this type of stack, the production of electrical connections between the electrodes and the integrated circuit amplifiers is complex and restrictive. Furthermore, electrical isolation of these connections is a problem because they add many steps to the method of making the device compared with a method of making a sensor comprising coloured filters, which makes the production cost of such a sensor significantly more expensive than a sensor comprising coloured filters.

PRESENTATION OF THE INVENTION

One purpose of this invention is to disclose a photo-detecting device or an image sensor, for example of the "above IC" type, for which the structure in particular facilitates the production of electrical connections with the part of the device making the photo-detection, and that is not very expensive to make.

A photo-detecting device is disclosed to achieve this, comprising a plurality of pixels, each pixel comprising at least one alternate stack of several photodiodes and several electrodes composed of an electrically conducting material, each photodiode comprising at least one intrinsic amorphous semiconductor layer arranged in contact with at least one doped amorphous semiconductor layer distinct from the amorphous semiconductor layers in other photodiodes, each photodiode being arranged between at least two electrodes, and each pair of photodiodes comprising at least one of the electrodes arranged between these photodiodes.

An intrinsic amorphous semiconductor corresponds to an undoped amorphous semiconductor, in other words to which no doping agent has been deliberately added.

Therefore, this photo-detecting device comprises a photo-detecting structure comprising several amorphous semiconductor layers, for example amorphous silicon layers, possibly continuous, between electrodes that may be composed of an electrically conducting material transparent at the wavelengths to be detected, for example composed of ITO. Therefore in this stack there is an alternation of electrode-photodiode-electrode-photodiode, etc. Thus two photodiodes in the stack adjacent to each other are separated from each other by one of the electrodes composed of the electrically conducting material.

Thus, a photo-detecting device is disclosed, for example of the "above IC" type that does not have any coloured filters and that can be for example obtain colorimetric coordinates, for example like those conforming with CIE XYZ, RGB or Lab standards, of light received from the photo-detecting device, or the thermal image of a scene.

In particular, the size of the transparent electrodes may delimit pixels in the photo-detecting part of the device, in other words their dimensions may be slightly less than the size of the pixels.

Considering that the amorphous semiconductor is a bad electrical conductor when it is intrinsic and not illuminated, it electrically isolates the electrodes in shaded or non-illuminated zones, in other words around electrodes. Thus, this photo-detecting device does not necessitate any dielectric layers to electrically isolate the electrodes because this isolation role is fulfilled by non-illuminated amorphous semiconductor portions around the electrodes.

Nor does such a photo-detecting device need any additional dielectric layers or portions to electrically isolate the electrical connections that might be made through the amorphous semiconductor layers to make an electrical contact with electrodes without specific isolation steps for these connections. Furthermore, this lack of dielectric layers in the photo-detecting structure makes the effective surface area dedicated to the collection of light larger than the surface areas dedicated to the collection of light in devices according to prior art.

This photo-detecting device allows larger pixels than are possible with a photo-detecting device comprising coloured filters, in other words pixels for which the dimensions approximately perpendicular to light rays received by the sensor are larger than the corresponding dimensions of pixels in photo-detecting devices with coloured filters, because in this device, each pixel outputs several signals (one signal per photodiode), for example at least two signals in order to find the colorimetric coordinates of received light, while four pixels are necessary in a photo-detecting device comprising coloured filters arranged as a Bayer filter to obtain the same information.

The detecting material may be chosen such that it is sensitive only to the light spectrum that will be detected by the photo-detecting device. In the case in which the photo-detecting device is intended to detect colours in the range of visible light wavelengths (between about 380 nm and 780 nm), the amorphous semiconductor may be silicon because this semiconductor is transparent to infrared, and the optics, for example micro-lenses that may be coupled to the photo-detecting device, are usually opaque to ultra-violets. Thus, only the visible spectrum will be detected by the photo-detecting device without adding any additional filter means that are conventionally associated with Bayer filters according to prior art.

A photo-detecting device is also disclosed comprising a plurality of pixels, each pixel comprising at least one alternating stack of several photodiodes and several electrodes composed of an electrically conducting material, in which:
  each photodiode comprises at least one intrinsic amorphous semiconductor layer arranged in contact with at least one doped amorphous semiconductor layer distinct from the semiconductor layers of the other photodiodes, each photodiode being arranged between at least two of said electrodes, and each pair of photodiodes comprising at least one of the electrodes arranged between these photodiodes,
  in each pixel, each electrode comprises at least one portion of electrically conducting material not superposed on the other pixel electrodes and electrically connected to at least one interconnection hole passing through the amorphous semiconductor layers and said portion not superposed on other electrodes, the interconnection hole being filled with at least one electrically conducting material,
  in each pixel, portions of an electrically conducting material are superposed approximately on each of said portions of electrodes not superposed on other electrodes of the pixel and arranged above the amorphous semiconductor layers.

Thus, the electrical connections of electrodes to which they are not connected are electrically isolated. The electrodes in shaded or non-illuminated zones, in other words around the sides of electrodes, are also electrically isolated.

Each pixel in the device may comprise a stack of at least two photodiodes.

In each pixel, each electrode may comprise at least one portion of an electrically conducting material not superposed on other pixel electrodes and electrically connected to at least one interconnection hole, or via, passing through the amorphous semiconductor layers and said portion not superposed on the other electrodes, the interconnection hole possibly being filled with at least one electrically conducting material. Thus, electrical connections can be made in the form of vias, these connections being connected to the electrodes of the photo-detection device and not requiring any electrical isolation elements other than the amorphous semiconductor layers.

The device may also comprise at least one integrated circuit electrically connected to at least one layer of electrical interconnections arranged between the integrated circuit and the stack of photodiodes, the electrically conducting material of the interconnection holes being electrically connected to at least the layer of electrical interconnections.

In each pixel, one of the electrodes may be placed between the layer of electrical interconnections and the stack of photodiodes, and the other electrodes of the pixel possibly being composed of at least one material transparent at the wavelengths to be detected by the photodiodes.

The electrically conducting material of the interconnection holes may be electrically connected to the layer of electrical interconnections through at least one portion of electrically conducting material arranged at said one of the electrodes located between the layer of electrical interconnections and the stack of photodiodes.

In each pixel, portions of an electrically conducting material may be approximately superposed on said portions of electrodes not superposed on other electrodes of the pixel, the amorphous semiconductor layers possibly being arranged between said portions of electrically conducting material and the layer of electrical interconnections.

In each pixel, the electrodes may be electrically isolated from the electrodes of adjacent pixels by portions of amorphous semiconductor layers and/or portions of at least one dielectric material arranged between the stacks of photodiodes of two adjacent pixels.

The intrinsic amorphous semiconductor layers and/or the doped amorphous semiconductor layers may be common to several pixels of the device.

At least one of the electrodes may be common to several pixels of the device.

The device may also comprise at least one passivation layer covering the stack of photodiodes.

Each pixel may comprise at least one micro-lens arranged on the passivation layer.

The amorphous semiconductor layers may be composed of Si:H (hydrogenated silicon) and/or Ge and/or SiGe and/or CdTe:O (oxygenated cadmium telluride) and/or AsGa.

Intrinsic amorphous semiconductor layers may be in contact with electrodes through at least one layer composed of an electrically conducting material or a doped amorphous semiconductor.

A method of making a photo-detecting device comprising a plurality of pixels is also disclosed, the method comprising the production of at least one alternating stack of several photodiodes and several electrodes composed of an electrically conducting material for each pixel, such that each photodiode comprises at least one layer of intrinsic amorphous semiconductor arranged in contact with at least one layer of doped amorphous semiconductor distinct from the amorphous semiconductor layers of other photodiodes, each photodiode being arranged between at least two electrodes, and each pair of photodiodes comprising at least one of the electrodes arranged between these photodiodes.

A method of making a photo-detecting device comprising a plurality of pixels is also disclosed, the method comprising the following for each pixel:

production of at least one alternating stack of several photodiodes and several electrodes composed of an electrically conducting material, such that each photodiode comprises at least one intrinsic amorphous semiconductor layer arranged in contact with at least one doped amorphous semiconductor layer, these two layers being distinct from the amorphous semiconductor layers of the other photodiodes, each photodiode being arranged between at least two said electrodes, and each pair of photodiodes comprising at least one of the electrodes arranged between these photodiodes, production of interconnection holes through portions of electrodes not superposed on other pixel electrodes and amorphous semiconductor layers, and then the deposit of at least one electrically conducting material in the interconnection holes, production of portions of an electrically conducting material such that said portions are practically superposed on each said portion of electrodes not superposed on the other electrodes of the pixel and arranged above the amorphous semiconductor layers.

At least part of the electrodes and/or amorphous semiconductor layers may be made by implementing a step to deposit the material of the electrodes or the amorphous semiconductor, then photolithography and etching steps of the deposited material.

The method may also include the production of interconnection holes for each pixel through portions of electrodes not superposed on other electrodes of the pixel and amorphous semiconductor layers, and then the deposit of at least one electrically conducting material in the interconnection holes.

BRIEF DESCRIPTION OF THE DRAWINGS

This invention will be better understood after reading the description of example embodiments given purely for information and in no way limitative with reference to the appended drawings on which.

Identical, similar or equivalent parts in the various figures described below are identified with the same numeric references to facilitate the comparison of one figure with another.

The different parts shown in the figures are not necessarily shown at a uniform scale, to make the figures more easily legible.

The different possibilities (variants and embodiments) must be understood as not being exclusive with each other and they may be combined with each other.

DETAILED PRESENTATION OF PARTICULAR EMBODIMENTS

Figure 1:
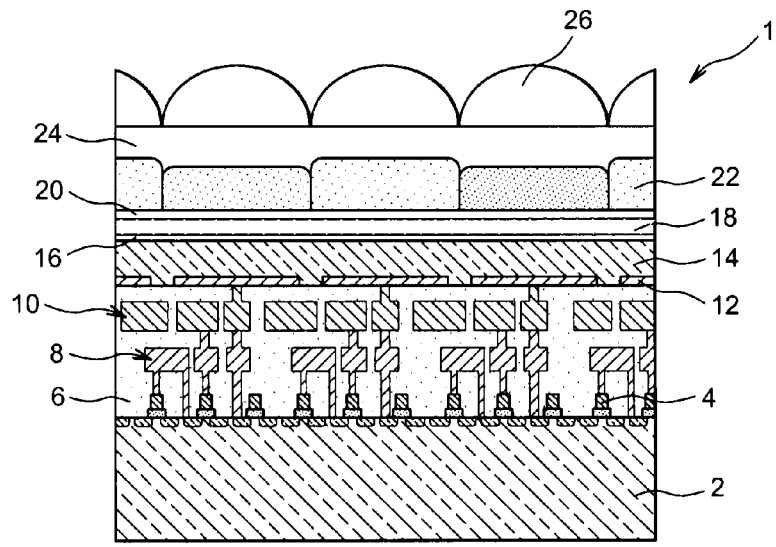
FIG. 1 shows a CMOS image sensor of the "above IC" type with coloured filters according to prior art.
Figure 2:
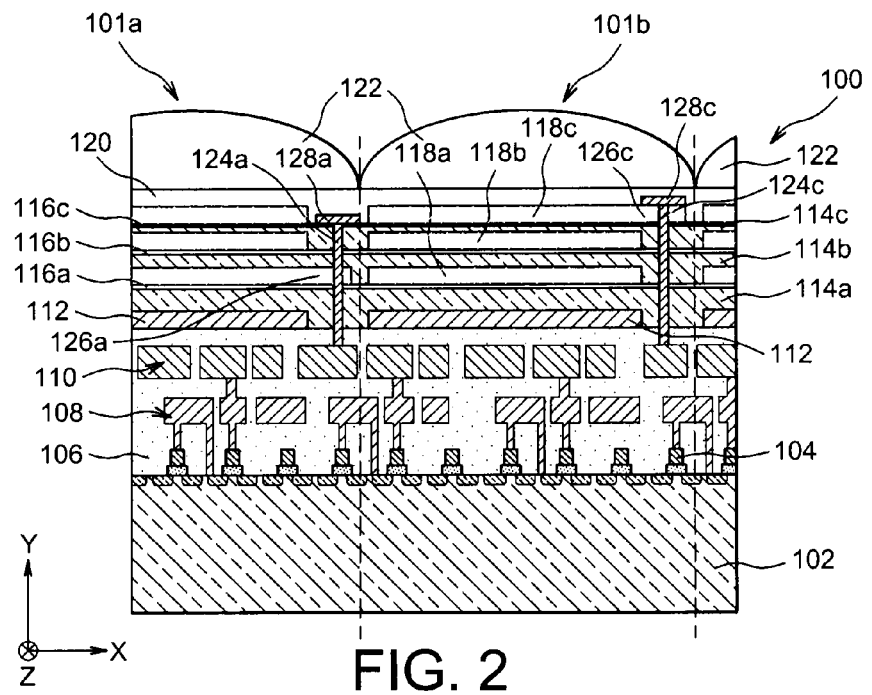
FIG. 2 shows a photo-detecting device of the "above IC" type without coloured filters, according to a first embodiment of this invention.

Refer firstly to FIG. 2 that shows a photo-detecting device 100 or an image sensor, of the "above IC" type according to a first embodiment, without any coloured filters.

In a manner similar to sensor 1 according to previously described prior art, the photo-detecting device 100 is composed of two parts: a photo-detection part formed by a retina, and a part that processes electrical charges generated by the retina formed particularly by an integrated circuit, the retina being arranged above the integrated circuit (above IC). The integrated circuit comprises a substrate 102, for example composed of silicon, on which CMOS transistors 104 are made. A dielectric layer 106, for example composed of $SiO_2$, covers the CMOS transistors 104. Several layers or levels of electrical interconnections electrically connected to each other and to the CMOS transistors 104 are made in the dielectric layer 106. In the example in FIG. 2, the sensor 100 comprises a first interconnection layer 108 and a second interconnection layer 110.

The retina formed above the dielectric layer 106 comprises lower electrodes 112 arranged on the dielectric layer 106. In this first embodiment, each pixel of the sensor 100 comprises a lower electrode 112. These lower electrodes 112 may be composed of an electrically conducting material capable of absorbing light such as graphite and/or graphen, or reflecting light such as metal (for example aluminium and/or chromium and/or copper and/or tungsten and/or titanium), or a material transparent to light such as ITO and/or $SnO_2$:F and/or $Cd_2SnO_4$ and/or $Zn_2SnO_4$ and/or ZnO. The choice of the material for the lower electrodes 112 is made particularly depending on the optical conditions imposed by the nature of the semiconductor placed on these electrodes. The material of the first electrode will be chosen to be either reflecting to increase the signal from the device or absorbing if this signal is sufficiently strong, depending on the absorption capacity of the semiconductor.

Each of the lower electrodes 112 in each pixel of the device 100 (two pixels 101a and 101b are shown in FIG. 2) is covered by a stack of layers forming several photodiodes, for example three in the example in FIG. 2. Each photodiode comprises an intrinsic amorphous semiconductor layer 114a, 114b, 114c, arranged in contact with an n or p type doped amorphous semiconductor layer 116a, 116b, 116c. A transparent conducting electrode 118a, 118b, 118c is also arranged in contact with each of the doped amorphous semiconductor layers 116a-116c.

The amorphous semiconductor may be composed of Si:H, Ge, SiGe, CdTe:O or AsGa. Furthermore, in the example in FIG. 2, the amorphous semiconductor layers 114 and 116 are continuous between the pixels of the sensor 100, in other words are common for all pixels in the sensor 100.

For example, the electrodes 118a-118c have a thickness (dimension along the y axis shown in FIG. 2) between about 30 nm and 300 nm when these electrodes are composed of a transparent conducting material such as ITO.

In one variant, electrodes 118a-118c can be made in the form of a metal layer, for example composed of aluminium and with a thickness of between 1 nm and 20 nm.

In another variant, it is also possible that each electrode 118a-118c is formed by a stack of several layers of electrically conducting materials transparent to light received by the photo-detecting device 100. The size of the electrodes 118a-118c which is approximately the same for all photodiodes and all pixels, delimits the size of photo sensitive zones of the sensor 100.

In order to improve the electrical contact between electrodes 118a-118c and doped amorphous semiconductor layers 116a-116c on which the electrodes 118a-118c are arranged, it is possible that an electrically conducting layer not shown in FIG. 2 should be placed between an electrode 118a-118c and a doped amorphous semiconductor layer 116a-116c. In this case, the thickness of this electrically conducting interface layer is chosen to be sufficiently small, in other words between about 1 nm and 20 nm, so that it is optically transparent.

The intrinsic amorphous semiconductor layers 114a-114c and the very thin doped layers 116a-116c that are therefore only very slightly conducting, provide electrical isolation between the electrodes located on the same level, in other words adjacent to each other, between two adjacent pixels of the device. Thus, the first intrinsic amorphous semiconductor layer 114a provides electrical isolation between the lower electrodes 112. The second and third intrinsic amorphous semiconductor layers 114b and 114c create electrical isolation between electrodes 118a and electrodes 118b. The electrodes 118c are electrically isolated from each other by a dielectric layer 120 covering these electrodes 118c and that also forms a planarisation layer on which micro-lenses 122 are arranged (one per pixel), each of these micro-lenses 122 being capable of concentrating light received at each pixel on the photodiodes.

Each electrode 118a-118c in each pixel comprises a main part, for example with an approximately rectangular shape, and a portion of an electrically conducting material not superposed on the other electrodes of the pixels. These portions, offset from the other electrodes of the pixel, enable electrodes 118a-118c to be electrically connected to the integrated circuit of the sensor 100 through interconnection holes, also called vias, for example composed of metal and passing through stacks of amorphous semiconductor layers 114a-114c, 116a-116c to reach and be electrically connected to the interconnection layers 108, 110, while remaining electrically isolated from other electrodes in the pixel.

For the pixel 101a of the device 100 shown in FIG. 2, the first electrode 118a comprises such a portion 126a that is not superposed on the electrodes 118b, 118c of the pixel 101a and through which a metallic interconnection hole 124a passes. Thus, the interconnection hole 124a passes through the stack of amorphous semiconductor layers 114a-114c, 116a-116c and electrically connects the first electrode 118a through the portion 126a to the second interconnections layer 110 while remaining electrically isolated from the other electrodes 118b and 118c of pixel 101a. Although the other electrodes 118b, 118c of pixel 101a are not shown in FIG. 2, each also comprises a portion of electrically conducting material not superposed on the other electrodes of the pixel 101a and electrically connected to the interconnection layers 108 or 110 through an interconnection hole passing through the amorphous semiconductor layers 114a-114c, 116a-116c while remaining electrically isolated from the other electrodes of the pixel 101a.

For the pixel 101b of the device 100, the third electrode 118c comprises a portion 126c that is not superposed on the other electrodes 118a, 118b of the pixel 101b and through which an interconnection hole 124b passes. The interconnection hole 124b passes through amorphous semiconductor layers 114a-114c and 116a-116c and electrically connects the third electrode 118c through its portion 126c to the second interconnection level 110. Similarly, each of the other electrodes 118a, 118b of the pixel 101b also comprises a portion of electrically conducting material not shown in FIG. 2, not superposed on the other electrodes of the pixel 101b and electrically connected to the interconnection layers 108 or 110 through an interconnection hole passing through the amorphous semiconductor layers 114a-114c, 116a-116c without being in electrical contact with the other electrodes of the pixel 101b.

Each interconnection hole 124a, 124c comprises an upper portion 128a, 128c masking the portions 126a, 126c of electrodes 118a, 118c from light received by the device 100. In one variant, the interconnection holes 124a, 124b do not necessarily comprise these upper portions 128a, 128c.

When the sensor 100 does not comprise any micro-lenses 122, the interconnection holes are preferably made with such upper portions to mask the portions of the pixel that are not used to make a photo-electric conversion of received light, to avoid the amorphous semiconductor from becoming conducting due to the generated charges.

Thus, several photodiodes (three in the example shown in FIG. 2) are formed stacked on top of each other in each pixel in the device 100, each of the photodiodes being formed by the junction between one of the intrinsic amorphous semiconductor layers 114a-114c and one of the doped amorphous semiconductor layers 116a-116c. Light passing through these amorphous silicon layers 114a-114c, 116a-116c creates electrical charges that are then separated by the electrical field present in the photodiodes.

The collected electrical charges form the electrical signal that is transferred to the transistors 104, in other words to the integrated circuit of the device 100 through interconnection holes, and then amplified by the integrated circuit of the photo-detecting device 100. The result obtained for each pixel is one electrical signal for each photodiode. Considering that each photodiode is arranged between two electrodes in the device 100 in FIG. 2, the created electrical charges can be collected despite the short life of these charges before their recombination and the low conductivity of the amorphous semiconductor.

In general, each pixel in the photo-detecting device 100 may comprise n photodiodes and n+1 electrodes where n is an integer number ≥2. Although the example in FIG. 2 shows that each pixel of the device 100 comprises electrodes that are independent of each other, electrodes in each pixel located on the same level can be formed by an electrode common to several or all pixels.

The thicknesses of the different amorphous semiconductor layers are chosen as a function of their optical indexes and optical absorption laws of the different materials that are variable as a function of the wavelength of received light. The total of these thicknesses may for example be less than about 0.7 μm, and the thickness of each of the layers may for example be between about 0.01 μm and 0.4 μm. The lengths and widths of the pixels (corresponding to the dimensions in the (X,Z) plane shown in FIG. 2) may for example be larger than about 0.7 μm, and usually equal to about 2 μm. Considering that the width/height and length/height ratios of the pixels are large, the photo-detecting device has a better definition of colours and pixels.

This also prevents a photon arriving obliquely onto the upper surface of a pixel from being immediately absorbed and therefore having its trajectory finish in the adjacent pixel, unlike photo-detecting devices according to prior art in which the height of pixels is greater than their width (or length). Therefore the photo-detecting device 100 prevents images from being blurred or iridescence from occurring at colour limits.

The thicknesses of the amorphous semiconductor layers of the different photodiodes in a single pixel are different from each other. For example, these thicknesses may be chosen such that they decrease in the direction from the integrated circuit of the device 100 towards the passivation layer 120. Therefore, the intrinsic amorphous semiconductor layer closest to the integrated circuit or the interconnection levels (layer 114a in the example in FIG. 2) is the thickest. Therefore the intrinsic amorphous semiconductor layer closest to the face on which light enters the sensor 100 (layer 114c in the example in FIG. 2) or to the passivation layer 120, is the thinnest. On the example in FIG. 2, the first layer 114a is approximately 300 nm thick, the second layer 114b is approximately 100 nm thick, and the third layer 114c is approximately 15 nm thick.

Starting from the signals output from the three photodiodes of each pixel, the integrated circuit calculates three linear equations with three unknowns in order to obtain the colorimetric coordinates of received light, for example according to the standard in CIE 1931, with a minimum error and noise.

Figure 3A:
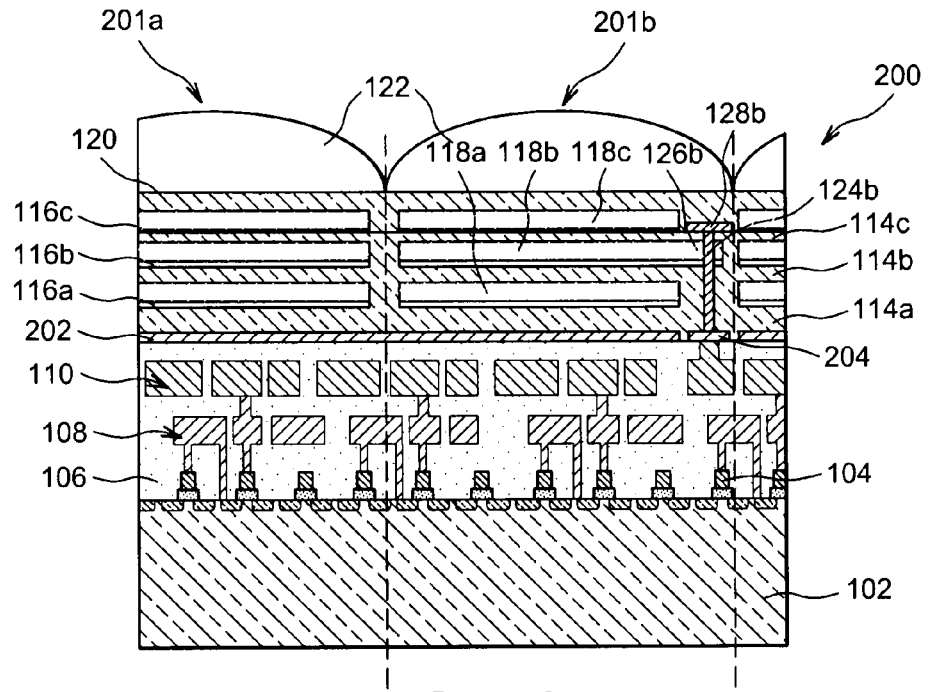
FIGS. 3A and 3B show a photo-detecting device of the "above IC" type without coloured filters, according to a second embodiment of this invention.
Figure 3B:
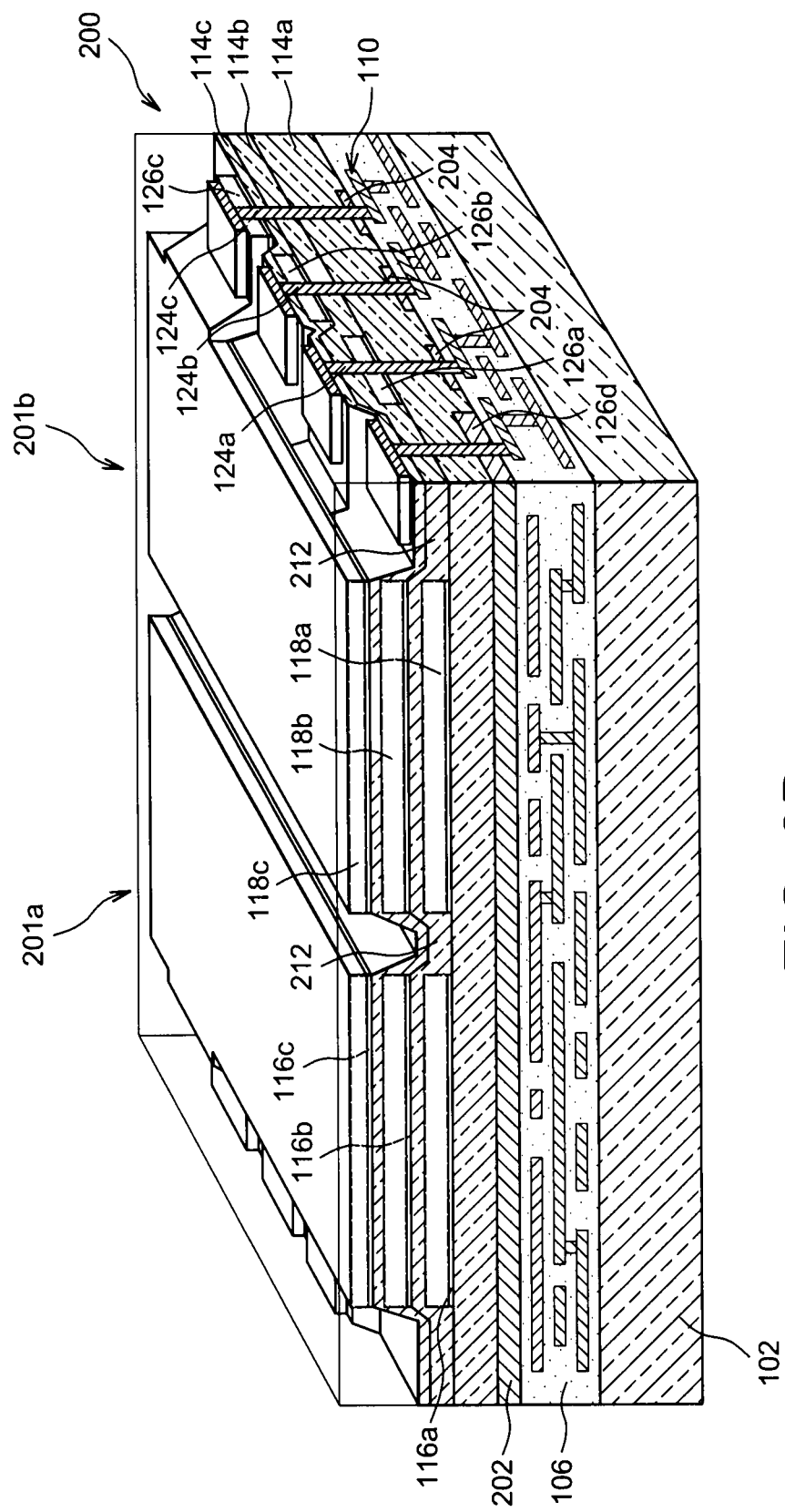

FIGS. 3A and 3B show a second embodiment of a photo-detecting device 200. Compared with the device 100 according to the first embodiment described above, the doped amorphous semiconductor layers 116a-116c are not continuous from one pixel in the device 200 to the next. Each of these layers 116a-116c is formed by distinct portions that are not electrically connected to each other from one pixel to the next. Furthermore, in this device 200, the lower electrodes 112 are replaced by a single electrode 202 common to all pixels in the photo-detecting device 200 and composed of a material not transparent to light. This lower common electrode 202 is interrupted at interconnection holes 124a-124c that are electrically connected to contact pads 204 placed at the same level as the lower common electrode 202 and making the electrical connection between the interconnection holes 124a-124c and interconnection layers 108, 110 of the photo-detecting device 200. Upper portions 128a-128c composed of the same material as that deposited in the interconnection holes are placed above the interconnection holes 124a-124c.

This second embodiment in particular is capable of making a lower electrode 202 composed of a conducting material other than the transparent conducting material used to make the other electrodes 118a-118c.

In this second embodiment, the interconnection holes 124a-124c are made by etching through amorphous semiconductor layers 114a-114c, 116a-116c and through portions 126a-126c that will be electrically connected to the interconnection holes 124a-124c.

These holes are advantageously etched with a single mask stopping at the contact pads 204. Finally, since the doped amorphous semiconductor layers 116a-116c are not continuous from one pixel of the device 200 to the next, but are formed by distinct portions not electrically connected to each other from one pixel to the next, therefore the electrical isolation between the electrodes and the interconnection holes from one pixel to the next is better than in the device 100 according to the first embodiment.

FIG. 3B shows a perspective view of two pixels 201a, 201b of the photo-detecting device 200. The micro-lenses 122 are not shown in this figure. However, steps between pixels are shown in FIG. 3B and not in FIG. 3A. In this second embodiment, it can be seen that each of the electrodes 118a-118c comprises a principal approximately rectangular shaped part and is electrically connected to the second interconnection layer 110 through interconnection holes 124a-124c electrically connected to portions 126a-126c of these electrodes. However, it is possible to have electrodes with different areas and/or shapes, for example due to steps between electrodes, while preferably maintaining the largest possible surface area. Portions 212 of intrinsic amorphous semiconductor layers 114a-114c at the steps formed particularly by the etched edges of the electrodes, provide electrical isolation between the electrodes 118a-118c of adjacent pixels and between interconnection holes 124a-124c of a single pixel.

It is possible that the common electrode 202 should be electrically connected to the interconnection layer 110 through interconnection holes made at each pixel of the device 200.

In one variant, it is also possible that the common electrode 202 is not electrically connected to the interconnection layer 110 at each pixel in the device 200, but only at part of the pixels of the device 200, or even when the material from which the common electrode 202 is made is strongly conducting, for example aluminium, only at a single pixel of the sensor 200 through a single interconnection hole.

Figure 4:
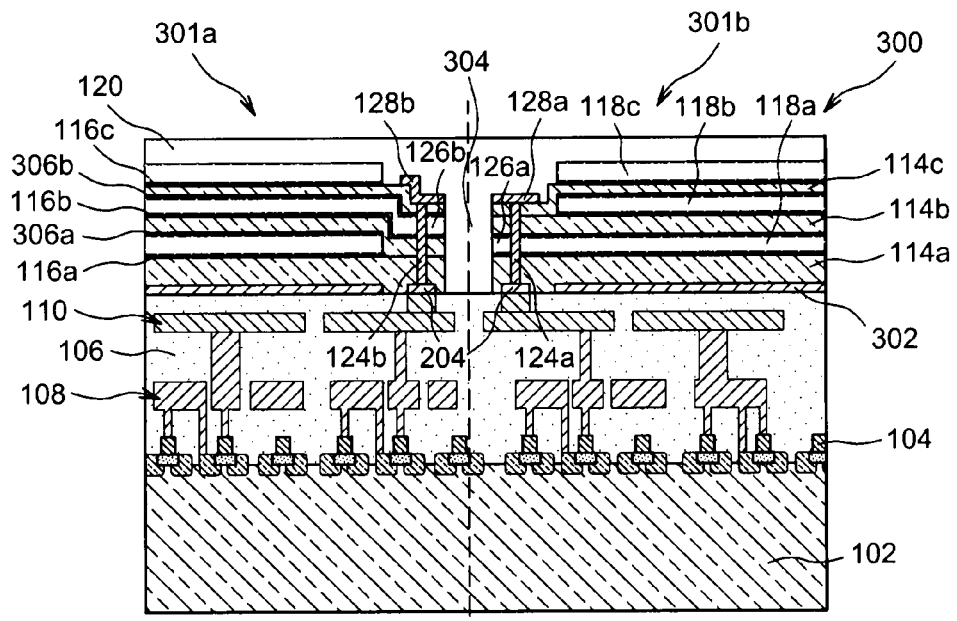
FIG. 4 shows a photo-detecting device of the "above IC" type without coloured filters, according to a third embodiment of this invention.

FIG. 4 shows a third embodiment of a photo-detecting device 300.

The difference from the previous two embodiments is that the amorphous silicon portions located between the pixels of the sensor 300 (two pixels 301a, 301b are shown in FIG. 4) are etched and then filled with a dielectric material forming isolation portions 304. In the example in FIG. 4, the isolation portion 304 electrically isolating pixels 301a, 301b is obtained from the material forming the planarisation layer 120 covering the stacks of amorphous semiconductor layers.

In this third embodiment, the photo-detecting device 300 also comprises contact layers 306a, 306b, for example composed of an electrically conducting material covering the electrodes, in this case the electrodes 118a, 118b of the first two photodiodes. These contact layers 306a, 306b are particularly useful for making transparent conducting electrodes 118a, 118b from a material with an electrical conductivity less than that of ITO. Thus, these electrodes 118a, 118b may be made for example from Sn doped $In_2O_3$, Al doped ZnO, F doped SnO, InZnO, InMoO, InTiO or $Ta_2O_5$. The thickness of these contact layers 306a, 306b is chosen to be sufficiently thin (for example between about 1 nm and 20 nm thick) so that these layers 306a, 306b are transparent to light or such that their light absorption is negligible, and that they may be etched at the same time as the material of the electrodes 118a, 118b. For example, the contact layers 306a, 306b may be composed of a transparent electrically conducting material (such as ITO), or composed of a metal (for example Al and/or Ti and/or W and/or Ta and/or Cr) or a doped amorphous semiconductor for example with doping type inverse to the doping of the doped semiconductor layers 116a, 116b.

In this embodiment, the isolation portions 304 are in contact with the dielectric layer 106, enabling electrical isolation between the elements of the pixels. In one variant, and particularly when the lower electrodes 302 are formed from a single electrode common to the different pixels of the device 300, it is possible that the isolation portions 304 do not pass through the lower electrodes 302 and instead stop above these lower electrodes 302.

Figure 5A:
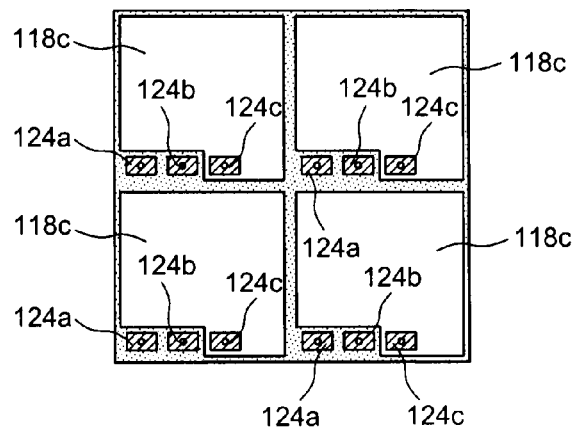
FIGS. 5A to 5C show top views of four pixels of different photo-detecting devices of the "above IC" type, according to several embodiments of this invention.
Figure 5B:
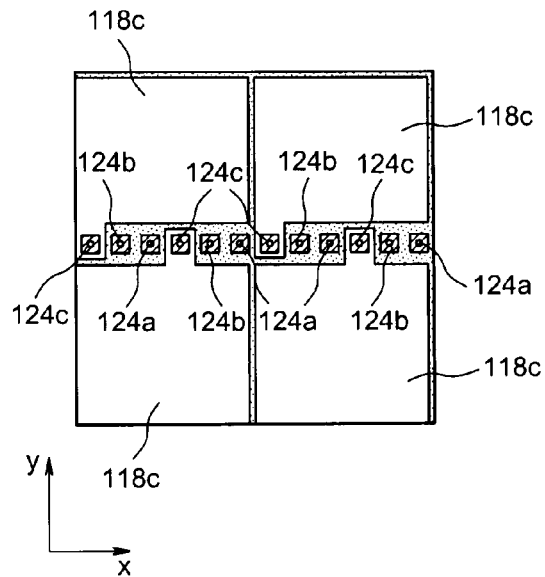
Figure 5C:
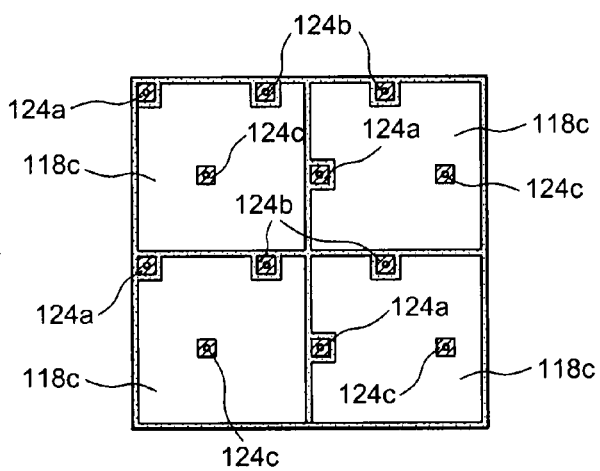

FIGS. 5A, 5B and 5C show top views of four pixels of different photo-detecting devices, for example similar to devices 100, 200 and 300 described above. In these figures, only the electrodes 118c located at the summits of stacks of photodiodes are shown. The electrodes 118c are electrically connected to interconnection holes 124c. The interconnection holes 124a and 124b are electrically connected to the electrodes 118a and 118b (not shown). In the example in FIG. 5A, the interconnection holes 124a-124c for each pixel in the photo-detecting device are arranged on one side of the electrode 118c, this arrangement possibly being similar for all pixels in the photo-detecting device. In the example in FIG. 5B, the interconnection holes 124a-124c of four pixels of the photo-detecting device are in line with each other along an axis parallel to the X axis shown in FIG. 5B.

This arrangement may be repeated for each group of four pixels in the device. In the example shown in FIG. 5C, the interconnection holes 124a-124c of each pixel are not in line with each other, but are arranged such that the interconnection holes 124a-124c are as far away from each other as possible, this applies equally to interconnection holes of a single pixel and to interconnection holes of adjacent pixels.

The photo-detecting devices 100, 200 and 300 described above may be made by using deposition, photolithography and etching steps successively on the integrated circuit, and more precisely on the dielectric layer 106, to make the stack of photodiodes. After making the stack of photodiodes, the interconnection holes are formed through amorphous semiconductor layers and portions of electrodes not superposed on the other electrodes of the pixel. An electrically conducting material is then deposited in the interconnection holes. The photo-detecting device may then be completed by the use of conventional steps for making image sensors (deposit of a planarisation layer, production of micro-lenses, etc.).

The invention claimed is:

1. A photo-detecting device comprising:
   a plurality of pixels, each pixel comprising at least one alternate stack of plural photodiodes and plural electrodes including an electrically conducting material, and wherein:
   each photodiode comprises at least one intrinsic amorphous semiconductor layer arranged in contact with at least one doped amorphous semiconductor layer distinct from the amorphous semiconductor layers in other photodiodes, each photodiode being arranged between at least two of the electrodes, and each pair of photodiodes comprising at least one of the electrodes arranged between the photodiodes;
   in each pixel, each electrode comprises at least one portion of electrically conducting material not superposed on other electrodes and electrically connected to at least one interconnection hole passing through the amorphous semiconductor layers and the portion not superposed on the other electrodes, the interconnection hole being filled with at least one electrically conducting material;
   in each pixel, portions of an electrically conducting material are superposed approximately on each of the portions of electrodes not superposed on other electrodes of the pixel and arranged above the amorphous semiconductor layers.

2. The device according to claim 1, wherein each pixel comprises a stack of at least two photodiodes.

3. The device according to claim 1, further comprising at least one integrated circuit electrically connected to at least one layer of electrical interconnections arranged between the integrated circuit and the stack of photodiodes, the electrically conducting material of the interconnection holes being electrically connected to at least the layer of electrical interconnections.

4. The device according to claim 3, wherein, in each pixel, one of the electrodes is placed between the layer of electrical interconnections and the stack of photodiodes, and the other electrodes of the pixel include at least one material transparent at wavelengths to be detected by the photodiodes.

5. The device according to claim 4, wherein the electrically conducting material of the interconnection holes is electrically connected to the layer of electrical interconnections through at least one portion of electrically conducting material arranged at the one of the electrodes located between the layer of electrical interconnections and the stack of photodiodes.

6. The device according to claim 1, wherein, in each pixel, the electrodes are electrically isolated from the electrodes of adjacent pixels by portions of amorphous semiconductor layers and/or portions of at least one dielectric material arranged between the stacks of photodiodes of two adjacent pixels.

7. The device according to claim 1, wherein the intrinsic amorphous semiconductor layers and/or the doped amorphous semiconductor layers are common to plural pixels of the device.

8. The device according to claim 1, wherein at least one of the electrodes is common to plural pixels of the device.

9. The device according to claim 1, further comprising at least one passivation layer covering the stack of photodiodes.

10. The device according to claim 9, wherein each pixel comprises at least one micro-lens arranged on the passivation layer.

11. The device according to claim 1, wherein the amorphous semiconductor layers are composed of Si:H, and/or Ge, and/or SiGe, and/or CdTe:O, and/or AsGa.

12. The device according to claim 1, wherein intrinsic amorphous semiconductor layers are in contact with electrodes through at least one layer including an electrically conducting material or a doped amorphous semiconductor.

13. A method of making a photo-detecting device comprising a plurality of pixels, the method comprising, for each pixel:
   producing at least one alternating stack of plural photodiodes and plural electrodes including an electrically conducting material, such that each photodiode comprises at least one layer of intrinsic amorphous semiconductor arranged in contact with at least one layer of doped amorphous semiconductor distinct from the amorphous semiconductor layers of other photodiodes, each photodiode being arranged between at least two of the electrodes, and each pair of photodiodes comprising at least one of the electrodes arranged between these photodiodes;
   producing interconnection holes through portions of electrodes not superposed on other pixel electrodes and amorphous semiconductor layers, and then depositing at least one electrically conducting material in the interconnection holes; and
   producing portions of an electrically conducting material such that the portions are practically superposed on each the portion of electrodes not superposed on the other electrodes of the pixel and arranged above the amorphous semiconductor layers.

14. The method according to claim 13, wherein at least part of the electrodes and/or amorphous semiconductor layers is/are made by depositing the material of the electrodes or the amorphous semiconductor, then photolithography and etching of the deposited material.

\* \* \* \* \*